(12) United States Patent
Carpenter et al.

(10) Patent No.: US 6,710,668 B1
(45) Date of Patent: Mar. 23, 2004

(54) GLITCHLESS WIDE-RANGE OSCILLATOR, AND METHOD THEREFOR

(75) Inventors: Gary Dale Carpenter, Austin, TX (US); Hung Cai Ngo, Austin, TX (US); Ivan Vo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/242,256

(22) Filed: Sep. 12, 2002

(51) Int. Cl.[7] .............................. H03B 5/20; H03B 5/24
(52) U.S. Cl. ......................... 331/57; 331/175; 331/179
(58) Field of Search .......................... 331/57, 74, 173, 331/175, 177 R, 179

(56) References Cited

U.S. PATENT DOCUMENTS 6,359,519 B1 * 3/2002 Farrow ........................ 331/57
6,388,533 B2 * 5/2002 Swoboda ..................... 331/57

* cited by examiner

*Primary Examiner*—David Mis
(74) *Attorney, Agent, or Firm*—Anthony V. S. England; Casimer K. Salys (57) ABSTRACT

According to an apparatus form of the invention, oscillator circuitry for operating a number of inverters in a loop (also known as a "ring") includes a number of inverters. The inverters include a series of M inverters and a series of N inverters. The M inverters have signal propagation delay of m and the N inverters have signal propagation delay of n. The circuitry also includes means for selecting whether to exclude the N inverters from operating in the loop operable for receiving a select signal on a data input. The selecting means times assertion of the select signal on an output to select the number of inverters. In order to glitchlessly change the number of inverters operating in the loop, the selecting means has a certain delay greater than delay n.

21 Claims, 7 Drawing Sheets

GLITCHLESS WIDE-RANGE OSCILLATOR, AND METHOD THEREFOR

BACKGROUND

1. Field of the Invention

This invention concerns oscillator circuitry, and more particularly concerns oscillator circuitry having a number of inverters operating in a ring.

2. Related Art

Oscillators are used in a wide range of applications, notably including clocks for processors. Processors in turn are increasingly used in a wide range of small devices for which economy of power consumption is desired, including cell phones, cameras, audio equipment, personal digital assistants and notebook computers. Reducing clock speed is an important capability for reducing power consumption.

In recent years processor clock speeds have increased so dramatically that there is a lot of room for reducing speed to achieve reduced power consumption while still having sufficient speed, at least in some circumstances, for substantial processing capability. An example of an oscillator design with a number of inverters operating in a ring and which achieves a range of frequency operation is U.S. patent application Ser. No. 09/974,969 "Multi-Mode VCO," filed Oct. 11, 2001, which is hereby incorporated herein by reference. However, even with the Multi-Mode VCO design it may not be possible to turn down clock speed to the extent which processing capability and application requirements may permit, particularly since the number of inverters in the basic oscillating loop remains fixed in at least one respect. Consequently, a need exists for improvements in variable frequency oscillator operation.

SUMMARY

The foregoing need is addressed in the present invention. According to an apparatus form of the invention, oscillator circuitry for operating a number of inverters in a loop (also known as a "ring") includes a number of inverters. The inverters include a series of M inverters and a series of N inverters. The M inverters have signal propagation delay of m and the N inverters have signal propagation delay of n. The circuitry also includes means for selecting whether to exclude the N inverters from operating in the loop, which includes receiving a select signal on a data input of the selecting means. The selecting means times assertion of the select signal on an output to select the number of inverters. In order to glitchlessly change the number of inverters operating in the loop, the assertion of the select signal is delayed by a certain delay greater than delay n.

In another aspect, the select signal is asserted the certain delay after a falling edge of the Mth inverter's output signal. Also, the selecting means includes a multiplexer having a certain switching delay, and in order to further ensure glitchless operation the certain delay is small enough such that select signal is asserted on the selecting means output at least the multiplexer switching delay before a next rising edge of the Mth inverter output signal.

Objects, advantages, additional aspects and other forms of the invention will become apparent upon reading the following detailed description and upon reference to the accompanying drawings.

DETAILED DESCRIPTION OF A PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

Figure 1:
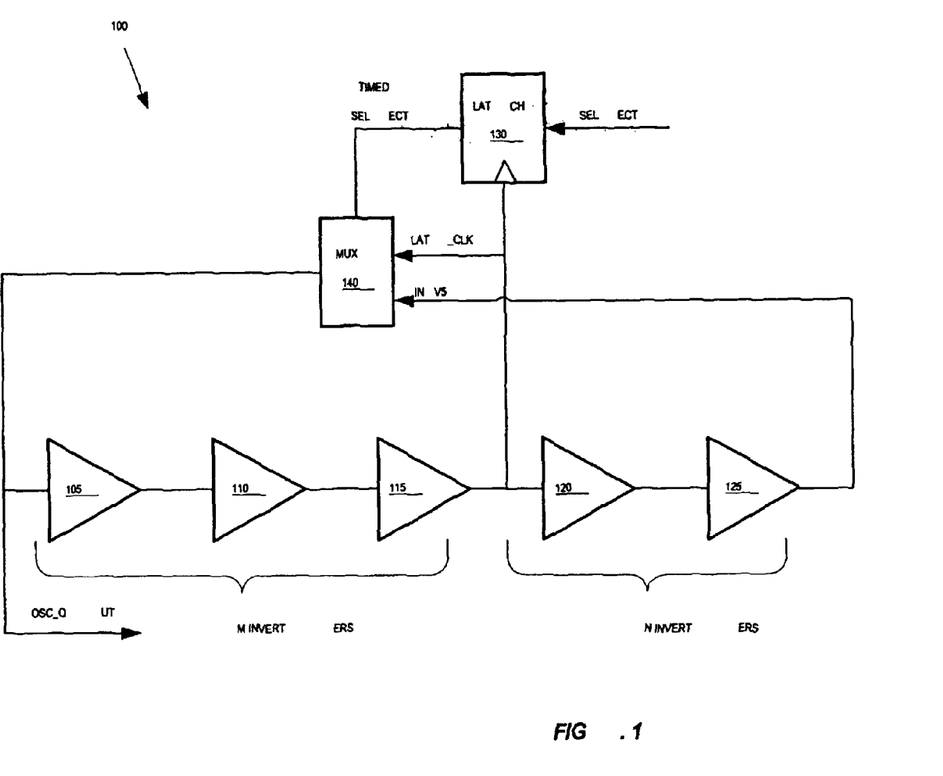
FIG. 1 illustrates circuitry of the present invention in block diagram form, according to an embodiment.

Referring now to FIG. 1, oscillator circuitry 100 is illustrated, according to an embodiment of the present invention. The circuitry 100 includes five inverters 105, 110, 115, 120 and 125 connected in series. The inverters are considered as two groups, a first group of three series-connected inverters and a second group of two series-connected inverters. The first 10 group of inverters is labeled as "M inverters" to indicate that the group may include a variable number M of inverters. Likewise, the second group is labeled as "N inverters" indicating that the group may include a variable number N of inverters. Generally speaking, according to the embodiment the number of inverters in both groups combined is an odd number and the number M is greater than N.

Considered as groups, the first series of M inverters has an input at the input to inverter 105, the first inverter in the series, and has an output at the output of inverter 115, the Mth inverter in the series. Likewise, the second series of N inverters has an input at input to inverter 120, the first inverter in the series, and has an output at the output of inverter 125, the Nth inverter in the series. The output of the M series of inverters is connected at a node labeled LAT_CLK to the input of the N series of inverters, a first data input for a multiplexer 140 and a control input for latch 130. The output of the N series is coupled to a second data input to the multiplexer 140 labeled INV5. The multiplexer 140 output is fed back to the input of the M series of inverters. Thus, the two series of inverters 105 through 125 and the multiplexer 140 are connected to form a loop, i.e., ring.

The multiplexer 140, of course, is operable to select one of the signals output by the two series of inverters to assert as the multiplexer 140 output OSC_OUT, which is also the circuitry 100 output. If the multiplexer 140 selects the N series, the loop includes all five, i.e., M+N, inverters 105 through 125. On the other hand, if the output from the M series is selected, the N series of inverters 120 and 125 is excluded from the loop, i.e., the loop includes only the M inverters 105 through 115.

The multiplexer 140 has a control input coupled at a node labeled TIMED SELECT to a latch 130 output. Selection by the multiplexer 140 is responsive to an output signal asserted by the latch 130 and received on the multiplexer control input. This TIMED SELECT output signal from the latch 130, in turn, is responsive to a SELECT signal received on the latch 130 control input Thus, the latch 130 is operable for receiving the SELECT signal on its data input and for timing the assertion, i.e., reassertion, of the SELECT signal as the TIMED SELECT signal on its output, in order to cause the multiplexer 140 to select the number of inverters operating in the loop.

Figure 2:
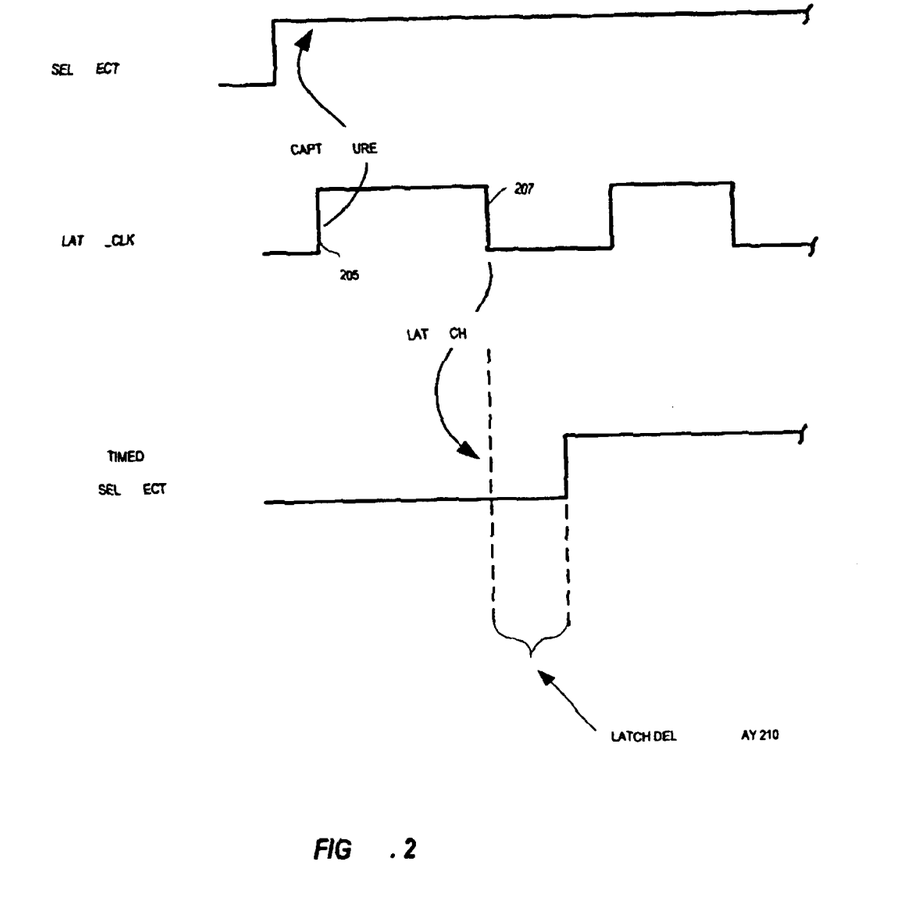
FIG. 2 illustrates timing of a latch delay for a latch of the circuitry of FIG. 1, according to an embodiment of the present invention.

Referring now to FIG. 2, aspects of the timing of assertion of the latch 130 output signal are illustrated, according to an embodiment. The timing of the assertion of the latch 130 output signal is responsive in the following respects to the output signal LAT_CLK from the M series of inverters received on the latch 130 control input. First, upon a rising edge 205 of the LAT_CLK signal the latch 130 captures the state of the SELECT signal. Then, at the next subsequent falling edge 207 of the LAT_CLK signal the latch 130 latches the captured signal. Note that according to the design there is a certain predetermined delay for the latch 130, shown as latch delay 210 in FIG. 2, such that the captured state is asserted by the TIMED SELECT signal precisely upon the latch delay 210 after the falling edge 207. That is, according to the embodiment signal propagation delay through the latch is carefully controlled to yield a specific latch delay 210 which achieves a certain transition window for the TIMED SELECT signal.

Figure 3:
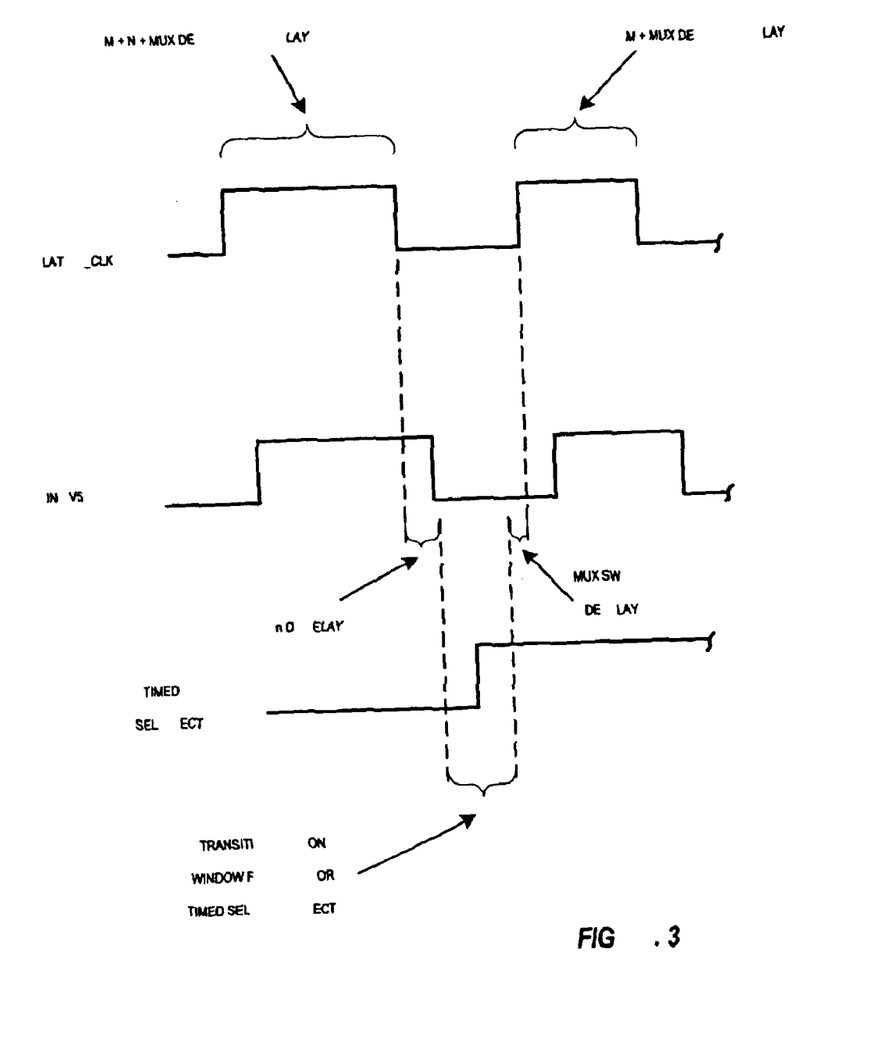
FIG. 3 illustrates timing of a transition window for a timed select signal output by the latch of FIG. 1, according to an embodiment of the present invention.

Referring now to FIG. 3, aspects of the required transition window are illustrated for transition of the TIMED SELECT signal, according to an embodiment. With the TIMED SELECT signal deasserted, the oscillator circuitry 100 of FIG. 1 operates in a mode with all of the M+N inverters, i.e., inverters 105 through 125, in the loop. Consequently, during this mode each phase of the circuitry 100 operating loop oscillation has a duration equal to the signal propagation delays through the M and N series of inverters and through the multiplexer 140. (Note that here and throughout the various FIG's the output signal of the N series of the inverters INV5 inherently lags the output of the M series of the inverters LAT_CLK by the amount of the N series delay, n.) Then, responsive to the TIMED SELECT signal being asserted, the oscillator circuitry 100 operates in a mode with the N series of inverters excluded from the loop, so that each phase of the loop oscillation in this mode has a duration equal to the signal propagation delays through the M series of inverters and the multiplexer 140, but not through the N series of inverters.

Note that there are two different multiplexer 140 delays of concern. The multiplexer delay referred to above concerning ordinary signal propagation delay through the multiplexer affects duration of the phase intervals and does not concern delay arising from switching by the multiplexer 140. The delay arising from switching by the multiplexer 140 affects the required duration of a window during which transition of the timed SELECT SIGNAL must occur to avoid a glitch. This multiplexer switching delay is labeled MUX SW DELAY in FIG. 3 and should not be confused with the ordinary multiplexer signal propagation delay labeled simply MUX DELAY in the various FIG's, including FIG. 3.

As shown in FIG. 3, in order to avoid a glitch the TIMED SELECT signal must transition during the transition window that is constrained by two timing issues. The timing constraints are met by the controlled latch delay 210 (FIG. 2). The first constraint concerns the phase difference between the LAT_CLK signal and the INV5 signal. This phase difference arises from the signal propagation delay n through the N series of inverters, labeled n DELAY in FIG. 3. The transition of TIMED SELECT must occur after the delay n so that the resultant signal output by the multiplexer 140 does not include a glitch arising from an extra edge from the INV5 signal. This will be further illustrated herein below in FIG. 4. The second constraint concerns the multiplexer 140 switching delay, labeled MUX SW DELAY in FIG. 3. That is, the transition of TIMED SELECT must also occur before the MUX SW DELAY so that the latch 130 (FIG. 1) does not fail to detect a rising edge of the M series output signal LAT_CLK that occurs before a next rising edge of the N series output signal INV5.

Figure 4:
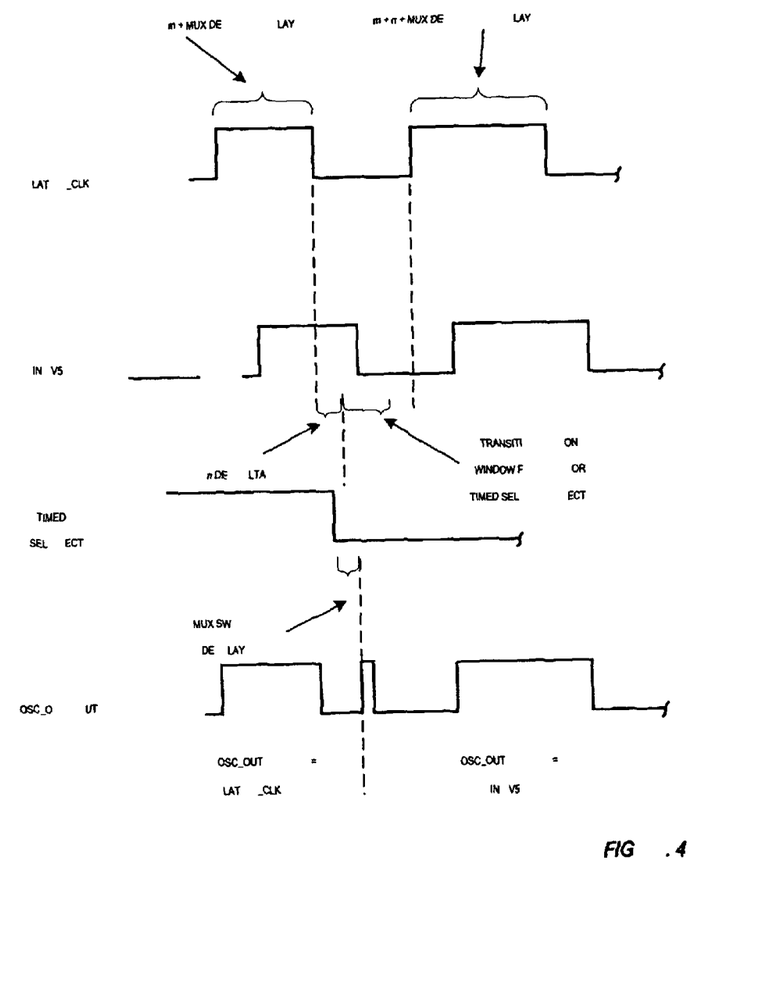
FIG. 4 illustrates an example of a glitch that could occur in a transition from one operating mode to another if it were not for advantageous features of the present invention.

Referring now to FIG. 4, an example is illustrated of a glitch that would arise if a falling edge of the TIMED SELECT signal occurred too soon after a falling edge of the LAT_CLK signal, that is, before the required transition window. At the beginning of the time interval shown in FIG. 4, the TIMED SELECT signal is asserted so that the oscillator circuitry 100 of FIG. 1 is operating in the mode with the N inverters excluded from the oscillating loop. Because the TIMED SELECT signal transitions too early in multiplexer 140 (FIG. 1) switches to asserting the N series output INV5 just before the INV5 signal falls. This results in an extra phase in the oscillator output OSC_OUT, as shown.

The above example illustrates an instance of a glitch. A glitch may be generally defined as an undesired switching of a clock, i.e., the oscillator output signal in the embodiment. The present invention is advantageous because it provides timing features in the oscillator circuitry 100 that prevent such glitches from occurring.

Figure 5:
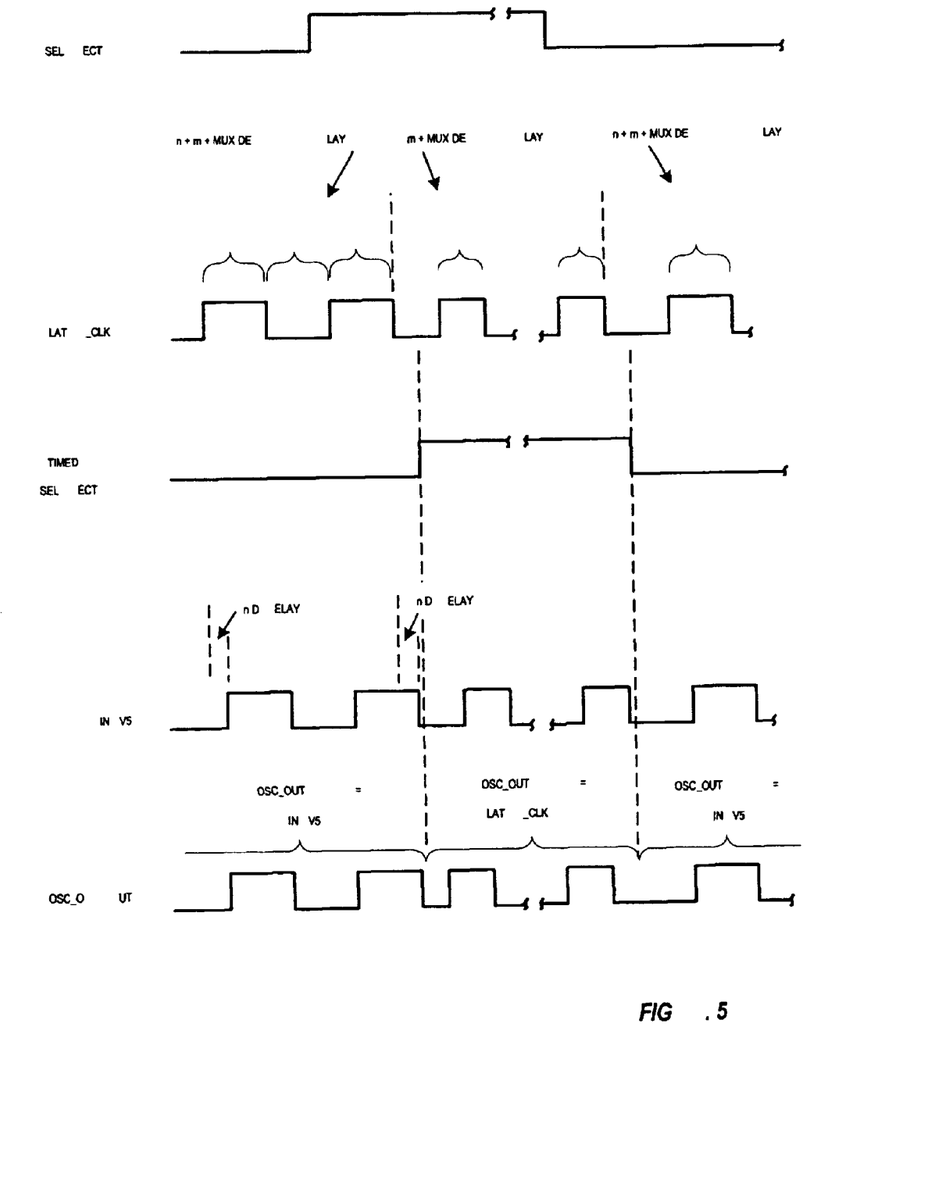
FIG. 5 illustrates certain additional timing aspects of operation for the circuitry of FIG. 1, according to an embodiment of the present invention.

Referring now to FIG. 5 in conjunction with FIG. 1, timing aspects are illustrated for two transitions of the SELECT and TIMED SELECT signals. Initially, the SELECT signal is low so that the circuitry 100 of FIG. 1 is operating in the mode in which all M+N inverters are included in the operating loop. At the next rising edge of the LAT_CLK signal after the SELECT signal is asserted the high state of the SELECT signal is captured by the latch 130. Then, at the next falling edge of the LAT_CLK signal, the high state of the SELECT signal is latched until the next rising edge of the LAT_CLK signal. Once the TIMED SELECT signal is asserted after the short switching delay 210 (FIG. 2) of latch 130, the output OSC_OUT of the multiplexer 140 switches to the output of the M series of inverters LAT_CLK. Note that the multiplexer 140 asserts this LAT_CLK signal as output signal OSC_OUT responsive to the TIMED SELECT signal after a short time delay which arises from switching delay of the multiplexer 140.

However, this delay is transparent, since the previously described timing constraints assure that the multiplexer 140 switches while both LAT_CLK and INV5 are low.

At the next rising edge of the LAT_CLK signal after the SELECT signal is deasserted, the low state of the SELECT signal is captured by the latch 130. Then, at the next falling edge of 20 the LAT_CLK signal, the low state of the SELECT signal is latched until the next rising edge of the LAT_CLK signal. The low state of the LAT_CLK signal is "asserted," i.e., deasserted, as the multiplexer 140 output signal OSC_OUT a short time thereafter, the time delay once again arising from the multiplexer 140 switching delay.

It should be appreciated that the transitions of the multiplexer 140 output signal, i.e., oscillator circuitry 100 output signal OSC_OUT occur glitchlessly due to the design of the circuitry 100, most especially latch 130, which carefully controls timing of the TIMED SELECT signal so that the signal is asserted at least the N inverter series delay n after a falling edge of the LAT_CLK signal and a least the multiplexer switching delay before the next rising edge of the LAT_CLK signal.

Figure 6:
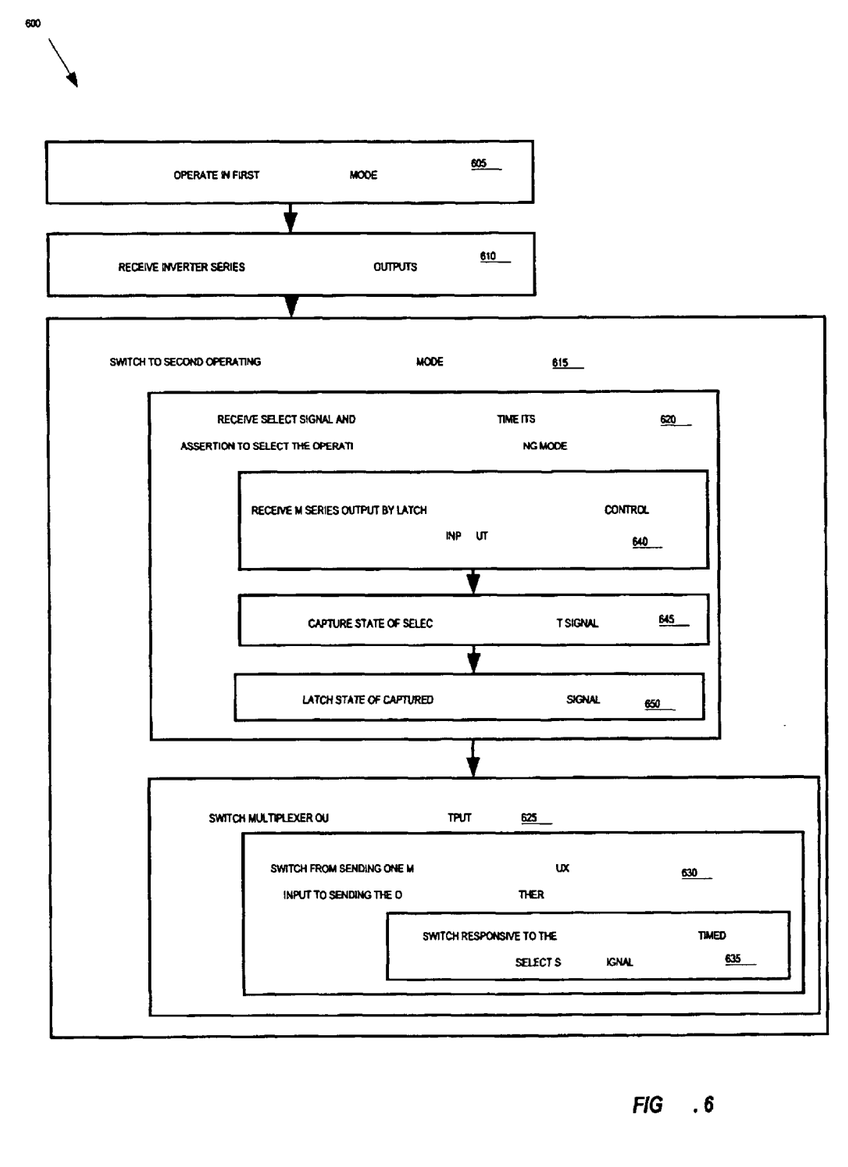
FIG. 6 illustrates certain method aspects of the invention in flow chart form, according to an embodiment.

Referring now to FIG. 6, method aspects of the invention are illustrated in a flow chart 600, according to an embodiment. In a first logic block 605 of flow chart 600 the oscillator circuitry 100 of FIG. 1 is operated in a first oscillating mode with the M and N inverters in the loop.

In a second logic block 610, the output signals from the M and N series of inverters are received by the multiplexer 140 on respective first and second data inputs.

In a third logic block 615, a selection is made to operate the circuitry in a second oscillating mode in which the N inverters are excluded from operating in the loop.

The logic block 615 includes a number of sub-blocks, as shown. In sub-block 620 a SELECT signal is received on a data input of a latch and the latch times assertion of the SELECT signal on an output of the latch to select the number of inverters. Sub-block 620 itself has sub-blocks 640 through 650. In sub-block 640 the latch receives the M series output signal on a control input coupled to the output of the M series of inverters. In sub-block 645 the latch captures a state of the SELECT signal responsive to a rising edge of the M series output signal. In sub-block 650 the captured state is latched. According to this, the latched state is asserted as the TIMED SELECT signal at the latch output responsive to a subsequent falling edge of the M series output signal and the latch delay thereafter.

In sub-block 625 the multiplexer is switched. Sub-block 625 includes sub-block 630, in which the multiplexer switches from sending one of the multiplexer data input signals as the multiplexer output to the M series input to sending the other of the multiplexer data input signals as the multiplexer output. This includes sub-block 635, according to which the switching of the multiplexer is responsive to the TIMED SELECT signal received on the multiplexer control input.

Figure 7:
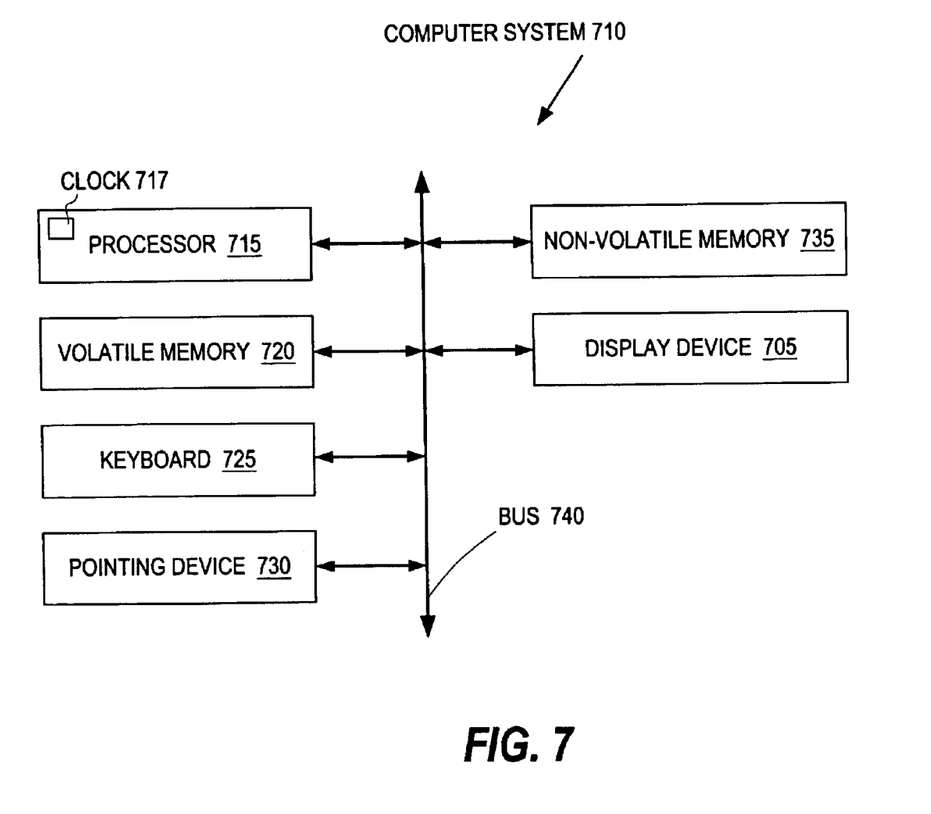
FIG. 7 illustrates a computer system using the oscillator circuitry of FIG. 1, according to an embodiment of the invention.

Referring to FIG. 7, a computer system 710 (also referred to as a "data processing system") is shown which uses the above described oscillator circuitry 100 (FIG. 1) in clock circuitry 717 of processor 715, according to an embodiment of the present invention. The system 710 includes a volatile memory 720, e.g., RAM, a keyboard 725, a pointing device 730, e.g., a mouse, a nonvolatile memory 735, e.g., ROM, hard disk, floppy disk, CD-ROM, and DVD, and a display device 705 having a display screen. Memory 720 and 735 are for storing a program instructions which are executable by processor 715 to implement various embodiments of a method in accordance with the present invention. Components included in system 710 are interconnected by bus 740. A communications device (not shown) may also be connected to bus 740 to enable information exchange between system 710 and other devices.

In various embodiments system 710 takes a variety of forms, including a personal computer system, mainframe computer system, workstation, Internet appliance, PDA, an embedded processor with memory, etc. That is, it should be understood that the term "computer system" is intended to encompass any device having a processor that executes instructions from a memory medium. The memory medium preferably stores instructions (also known as a "software program") for implementing various embodiments of a method in accordance with the present invention.

The description of the present embodiment has been presented for purposes of illustration, but is not intended to be exhaustive or to limit the invention to the form disclosed. Many modifications and variations will be apparent to those of ordinary skill in the art. For example, those of ordinary skill in the art will appreciate that in another embodiment the number of inverters N may be greater than M. However, this arrangement presents some difficulties that are not an issue in the embodiment set out herein above. That is, it is desirable to switch operating oscillator modes when both data input signals to the multiplexer are low, as in the embodiment described above. With N>M it is more difficult to guarantee both multiplexer data input signals are both low immediately after a falling edge of the one of the signals that times the latch. For these reasons it is not desirable for N to be greater than M, in at least some respects.

To reiterate, the embodiments were chosen and described in order to best explain the principles of the invention, the practical application, and to enable others of ordinary skill in the art to understand the invention. Various other embodiments having various modifications may be suited to a particular use contemplated, but may be within the scope of the present invention. Moreover, it should be understood that the actions in the following claims do not necessarily have to be performed in the particular sequence in which they are set out.

What is claimed is:

1. Oscillator circuitry for operating a number of inverters in a loop, comprising:
   a number of inverters, including a series of M inverters and a series of N inverters, herein the M inverters delay signal propagation there through by a certain delay m and the N inverters delay signal propagation there through by a certain delay n; and
   means for selecting whether to exclude the N inverters from operating in the loop, the selecting means operable for receiving a select signal on a data input and for timing assertion of the select signal on an output to select the number of inverters, wherein the selecting means has a certain delay greater than delay n, so that the number of inverters operating in the loop changes glitchiessly.

2. The oscillator circuitry of claim 1, wherein the M series of inverters and the N series of inverters have respective series inputs and outputs, and the select signal is asserted the certain delay after a falling output signal of the M series.

3. The oscillator circuitry of claim 2, wherein the selecting means includes a multiplexer having a multiplexer switching delay, and in order to further ensure glitchless operation the certain delay is small enough such that the timed select signal is asserted at least the multiplexer switching delay before a next rising M series output signal.

4. The oscillator circuitry of claim 3, the output of the M series being coupled to the input of the N series, and wherein the multiplexer has a first data input coupled to the M series output for receiving a signal from the M series of inverters, a second data input coupled to the N series output for receiving a signal from the N series of inverters and an output coupled to the M series input.

5. The oscillator circuitry of claim 4, wherein the multiplexer has a control input, and responsive to the timed select signal received on the multiplexer control input the multiplexer selects between asserting at the multiplexer output the signals received on the first and second multiplexer data inputs.

6. The oscillator circuitry of claim 5, wherein the selecting means includes a latch and the certain delay includes a delay of the latch, the latch having a control input coupled to the output of the M series of inverters for receiving the M series output signal, and wherein the latch captures a state of the select signal responsive to a rising edge of the M series output signal and subsequently latches the captured state, the latched state being asserted as the timed select signal at the latch output responsive to and the latch delay after a subsequent falling edge of the M series output signal.

7. The oscillator circuitry of claim 1, wherein M is greater than N.

8. A method in oscillator circuitry for operating a number of inverters in a loop, the inverters including a series of M inverters and a series of N inverters, wherein the M inverters delay signal propagation there through by a certain delay m and the N inverters delay signal propagation there through by a certain delay n, the method comprising the steps of:

operating the circuitry in a first oscillating mode with the M and N inverters in the loop; and selecting to operate the circuitry in a second oscillating mode in which the N inverters are excluded from operating in the loop, wherein the selecting includes receiving a select signal on an input and timing assertion of the select signal on an output after a certain delay greater than delay n to select the number of inverters, so that the number of inverters operating in the loop changes glitchlessly.

9. The method of claim 8, wherein the M series of inverters and the N series of inverters have respective series inputs and outputs, and the timing of the assertion of the select signal on the output comprises asserting the timed select signal the certain delay after a falling output signal of the M series.

10. The method of claim 9, wherein the timing of the assertion of the select signal on the output comprises switching a multiplexer having a multiplexer switching delay, and in order to further ensure glitchless operation the certain delay is small enough such that the timed select signal is asserted at least the multiplexer switching delay before a next rising M series output signal.

11. The method of claim 10, wherein the output of the M series are coupled to the input of the N series, the method comprising:

receiving the output signals from the M and N series of inverters by the multiplexer on respective first and second data inputs, and wherein the switching of the multiplexer comprises:

switching from sending one of the multiplexer data input signals as the multiplexer output to the M series input to sending the other of the multiplexer data input signals as the multiplexer output.

12. The method of claim 11, wherein the multiplexer has a control input coupled to the latch output, and wherein the switching by the multiplexer is responsive to the timed select signal received on the multiplexer control input.

13. The method of claim 11, comprising the step of:

receiving the M series output signal on a control input of a latch, the latch control input being coupled to the output of the M series of inverters.

14. The method of claim 13, wherein the certain delay includes a delay of the latch, comprising the steps of:

capturing, by the latch, a state of the select signal responsive to a rising edge of the M series output signal; and latching the captured state, wherein the latched state is asserted as the timed select signal at the latch output responsive to and the latch delay after a subsequent falling edge of the M series output signal.

15. The method of claim 8, wherein M is greater than N.

16. A data processing system comprising:

a central processing unit having clock circuitry; and a memory, wherein the clock circuitry includes oscillator circuitry for operating a number of inverters in a loop, the oscillator circuitry comprising:

a number of inverters, including a series of M inverters and a series of N inverters, wherein the M inverters delay signal propagation there through by a certain delay m and the N inverters delay signal propagation there through by a certain delay n; and means for selecting whether to exclude the N inverters from operating in the loop, the selecting means operable for receiving a select signal on a data input and for timing assertion of the select signal on an output to select the number of inverters, wherein the selecting means has a certain delay greater than delay n, so that the number of inverters operating in the loop changes glitchlessly.

17. The computer system of claim 16, wherein the M series of inverters and the N series of inverters have respective series inputs and outputs, and the select signal is asserted the certain delay after a falling output signal of the M series.

18. The computer system of claim 17, wherein the selecting means includes a multiplexer having a multiplexer switching delay, and in order to further ensure glitchless operation the certain delay is small enough such that the timed select signal is asserted at least the multiplexer switching delay before a next rising M series output signal.

19. The computer system of claim 18, the output of the M series being coupled to the input of the N series, and wherein the multiplexer has a first data input coupled to the M series output for receiving a signal from the M series of inverters, a second data input coupled to the N series output for receiving a signal from the N series of inverters and an output coupled to the M series input.

20. The computer system of claim 19, wherein the multiplexer has a control input, and responsive to the timed select signal received on the multiplexer control input the multiplexer selects between asserting at the multiplexer output the signals received on the first and second multiplexer data inputs.

21. The computer system of claim 20, wherein the selecting means includes a latch and the certain delay includes a delay of the latch, the latch having a control input coupled to the output of the M series of inverters for receiving the M series output signal, and wherein the latch captures a state of the select signal responsive to a rising edge of the M series output signal and subsequently latches the captured state, the latched state being asserted as the timed select signal at the latch output responsive to and the latch delay after a subsequent falling edge of the M series output signal.

* * * * *